United States Patent
Chiu et al.

(10) Patent No.: US 10,388,535 B1
(45) Date of Patent: Aug. 20, 2019

(54) WAFER PROCESSING METHOD WITH FULL EDGE TRIMMING

(71) Applicant: POWERTECH TECHNOLOGY INC., Hsinchu County (TW)

(72) Inventors: Chui-Liang Chiu, Hsinchu County (TW); Kun-Chi Hsu, Hsinchu County (TW); Jen-Tung Tseng, Hsinchu County (TW); Chin-Ta Wu, Hsinchu County (TW)

(73) Assignee: POWERTECH TECHNOLOGY INC., Hsinchu County (TW)

( * ) Notice: Subject to any disclaimer, the term of this patent is extended or adjusted under 35 U.S.C. 154(b) by 0 days.

(21) Appl. No.: 15/989,203

(22) Filed: May 25, 2018

(51) Int. Cl.
| | | |
|---|---|---|
| *H01L 21/00* | (2006.01) | |
| *H01L 21/304* | (2006.01) | |
| *H01L 21/687* | (2006.01) | |
| *H01L 21/683* | (2006.01) | |
| *H01L 21/67* | (2006.01) | |

(52) U.S. Cl.
CPC .... *H01L 21/3043* (2013.01); *H01L 21/67092* (2013.01); *H01L 21/6836* (2013.01); *H01L 21/68735* (2013.01); *H01L 2221/68327* (2013.01)

(58) Field of Classification Search
CPC .......... H01L 21/3043; H01L 21/67092; H01L 21/6836; H01L 21/6835
USPC .......................................................... 438/800
See application file for complete search history.

(56) References Cited

U.S. PATENT DOCUMENTS

| | | | |
|---|---|---|---|
| 2008/0044984 A1 | 2/2008 | Hsieh | |
| 2013/0210172 A1* | 8/2013 | Chen | B24B 37/005 438/8 |
| 2014/0054748 A1 | 2/2014 | Liu | |
| 2014/0073223 A1* | 3/2014 | Trojan | B24B 27/0023 451/1 |
| 2014/0113452 A1 | 4/2014 | Lin | |
| 2015/0170953 A1* | 6/2015 | Thallner | H01L 21/6835 438/459 |
| 2015/0332911 A1* | 11/2015 | Priewasser | H01L 21/6835 156/154 |
| 2017/0294300 A1* | 10/2017 | Kozai | G06T 7/0004 |

* cited by examiner

*Primary Examiner* — David S Blum
(74) *Attorney, Agent, or Firm* — Winston Hsu

(57) ABSTRACT

A wafer processing method uses a chuck table with smaller diameter than a semiconductor wafer to be processed. A cut through edge trimming is therefore implemented on the periphery of the semiconductor wafer to form a cut through straight side at the periphery and also form a flat portion at the periphery as a positioning means for taping and backside grind processes.

10 Claims, 4 Drawing Sheets

WAFER PROCESSING METHOD WITH FULL EDGE TRIMMING

BACKGROUND OF THE INVENTION

1. Field of the Invention

The invention relates to a wafer processing method, and more particularly, to a wafer processing method using full edge trimming and coming with flat edge positioning set-up.

2. Description of the Prior Art

As bonded wafer processing applications become more common, edge-oriented process technologies increase in importance. Among these edge-oriented processes, edge trimming is generally applied to bonded wafer assemblies for better preparation before the wafers are sent to following processes, e.g., half cutting, taping, and backside grind wafer mount, etc. Applying an edge trimming process generally removes a small amount of the diameter of the device wafer but not the carrier wafer, which eliminates the narrow edge area of the device wafer where bonding voids can often occur thus minimizing the area that is most likely to suffer chipping or other process issues. An additional benefit is that the wafer edge is generally the area of the wafer suffering the greatest non uniformity. Removing this area is often beneficial for subsequent wafer bonding steps.

However, current edge trimming processes are known as half-cut trimming, which indicates that the edge trimming goes half way of the thickness of the wafer device since the table that holds the wafer exists as a major concern for how deep the cutter may go. The half-way cut edge of the trimmed wafer therefore leaves an extra portion of tape in suspension in the taping process, leaving poor backside grind tape lamination on the wafer edge.

The V-notch at the edge of the wafer device is also an important positioning configuration for the follow-up processes. Undergoing the edge trimming process, however, will inevitably reduce the size of the V-notch at the edge of the wafer device or even vanishes the V-notch, which increases the difficulty for the follow-up processes to use the V-notch as positioning.

SUMMARY OF THE INVENTION

According to an aspect of the invention, a wafer processing method is provided to solve the above problem. The wafer processing method with full edge trimming includes following steps: providing a semiconductor wafer having a front side and a back side opposite to the front side, the semiconductor wafer further having a thickness and a first diameter; providing a chuck table with a second diameter for holding the semiconductor wafer wherein the second diameter is smaller than the first diameter; implementing edge trimming on a periphery of the semiconductor wafer to remove a portion of the semiconductor wafer of the thickness; implementing taping on the front side of the semiconductor wafer; and implementing backside grind on the back side of the semiconductor wafer.

According to another aspect of the invention, the wafer processing method further includes step: trimming the periphery of the semiconductor wafer to form a flat portion of the periphery of the semiconductor wafer, the flat portion connecting to an arc portion of the periphery to form the periphery of the semiconductor wafer.

According to another aspect of the invention, trimming the periphery of the semiconductor wafer to form the flat portion of the periphery is implemented in the edge trimming process.

According to another aspect of the invention, implementing taping on the front side of the semiconductor wafer uses the flat portion of the periphery as a positioning means.

According to another aspect of the invention, implementing backside grind on the back side of the semiconductor wafer uses the flat portion of the periphery as a positioning means.

According to another aspect of the invention, implementing edge trimming on the periphery forms a straight side at the periphery of the semiconductor wafer connecting the front side and the back side.

According to another aspect of the invention, implementing taping on the front side of the semiconductor wafer includes cutting tape along the straight side at the periphery of the semiconductor wafer.

According to another aspect of the invention, the straight side is perpendicular to both the front side and the back side.

According to another aspect of the invention, the wafer processing method further includes step: performing a half cut process to the front side or the back side of the semiconductor wafer before the semiconductor wafer is provided to the chuck table.

According to another aspect of the invention, the half cut process includes blade cut, laser grooving, and stealth dicing.

The wafer processing method provided by the embodiment of the invention uses a chuck table with smaller diameter than the semiconductor wafer to be processed. A cut through edge trimming is therefore implemented on the periphery of the semiconductor wafer to form a cut through straight side at the periphery and also form a flat portion at the periphery as a positioning means for taping and backside grind processes. Good backside grind tape lamination on the wafer edge is therefore provided to prevent edge chipping, the flat portion instead of conventional V-notch is easy for wafer position recognition, and the cutting tool for the edge trimming process requires far less dressing frequency due to the inessentiality of the blade shape.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. In the following discussion and in the claims, the terms "include" and "comprise" are used in an open-ended fashion. Also, the term "couple" is intended to mean either an indirect or direct electrical/mechanical connection. Thus, if a first device is coupled to a second device, that connection may be through a direct electrical/mechanical connection, or through an indirect electrical/mechanical connection via other devices and connections.

Figure 1:
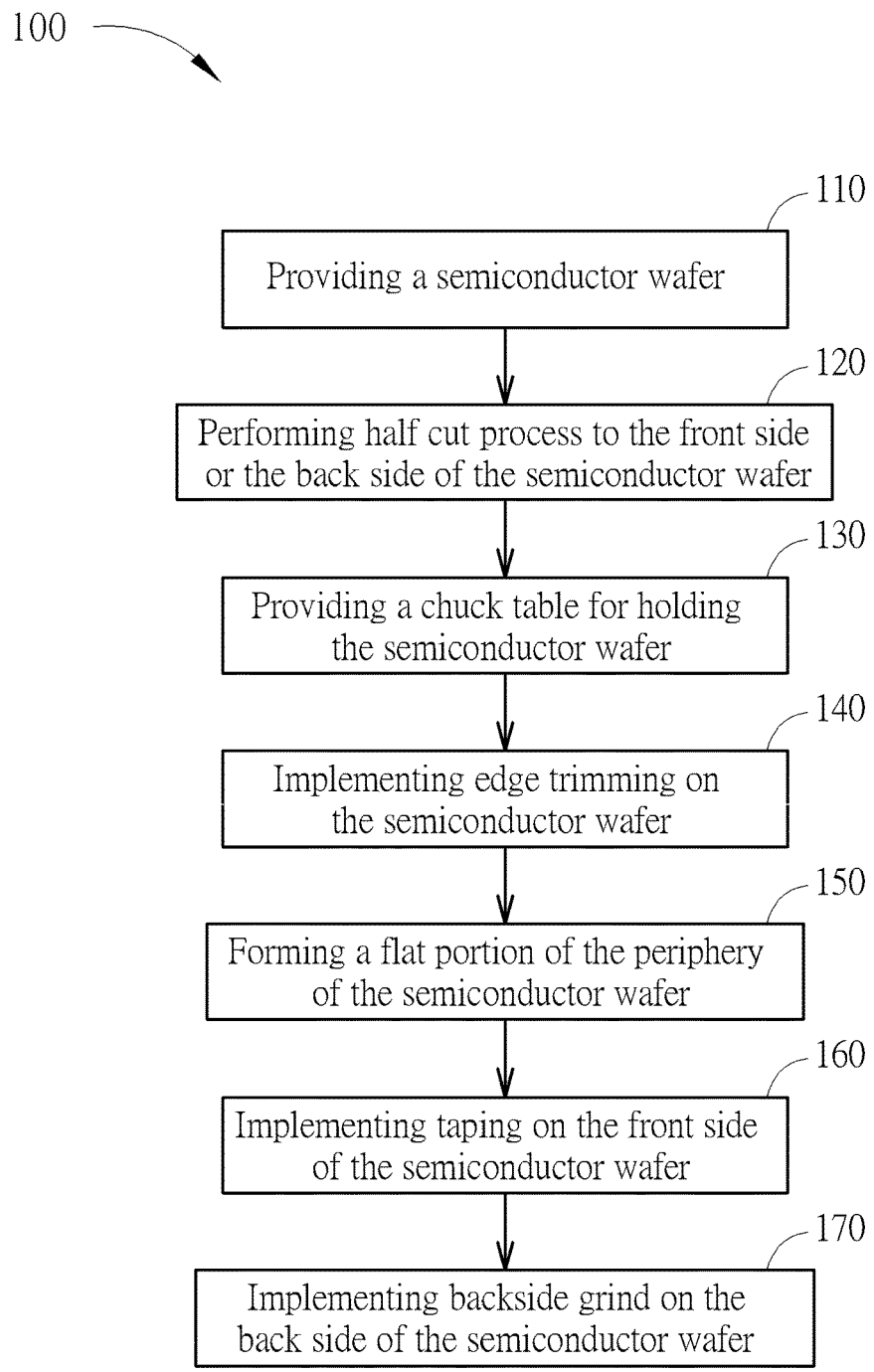
FIG. 1 is an illustration showing a wafer processing method according to an embodiment of the invention.

Please refer to FIG. 1, which is an illustration showing a wafer processing method according to an embodiment of the invention. The wafer processing method 100 is featured with full edge trimming for the edge trimming process and includes the following steps:

Step 110: providing a semiconductor wafer;

Step 120: performing half cut process to the front side or the back side of the semiconductor wafer;

Step 130: providing a chuck table for holding the semiconductor wafer;

Step 140: implementing edge trimming on the semiconductor wafer;

Step 150: forming a flat portion of the periphery of the semiconductor wafer;

Step 160: implementing taping on the front side of the semiconductor wafer;

Step 170: implementing backside grind on the back side of the semiconductor wafer.

Figure 2:
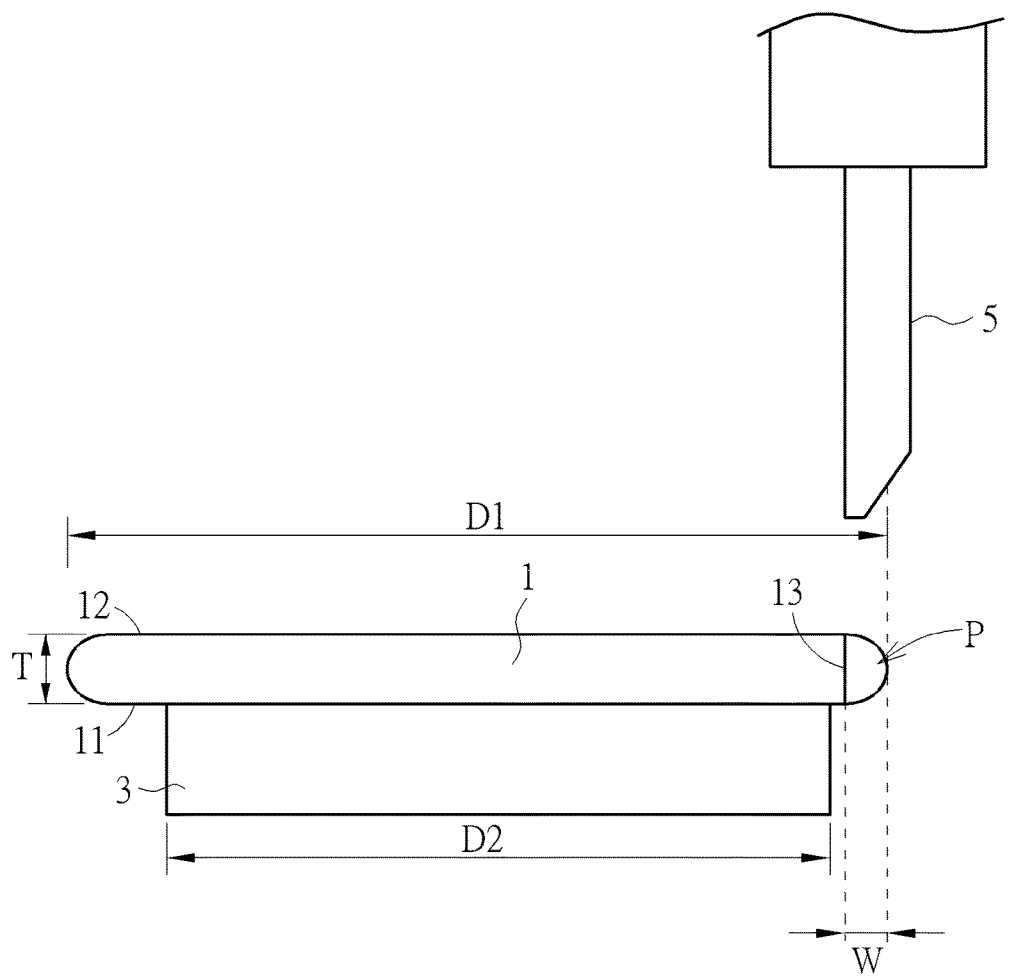
FIG. 2 is an illustration showing an embodiment of edge trimming process.

Please also refer to FIG. 2. FIG. 2 is an illustration showing an embodiment of edge trimming process. A Semiconductor wafer 1 is provided in Step 110. The semiconductor wafer 1 has a front side 11 and a back side 12 opposite to the front side 11. In particular, the semiconductor wafer 1 is provided to have thickness T and a first diameter D1. In one embodiment, the semiconductor wafer 1 sent to the processes provided in the invention is already undergone edge grinding for profiling at the periphery. In Step 120, a half cut process is performed to the front side 11 or the back side 12 of the semiconductor wafer 1 before provided to the chuck table 3 to reduce the overall thickness T, in one embodiment, to no more than half of the thickness T. Specifically, the half cut process in Step 120 may include, but not limited to, blade cut, laser grooving, and stealth dicing.

In Step 130, the chuck table 3 is provided for holding the semiconductor wafer 1 for follow-up edge trimming process. The chuck table 3 is provided with a second diameter D2 and in order to establish a circumstance where a cutting tool 5 is able to perform a cutting through trimming process on the semiconductor wafer 1, the second diameter D2 of the chuck table 3 is smaller than the first diameter D1 of the semiconductor wafer 1, in particular, smaller in radius no less than the amount to be trimmed, or W as illustrated in FIG. 2.

Figure 3:
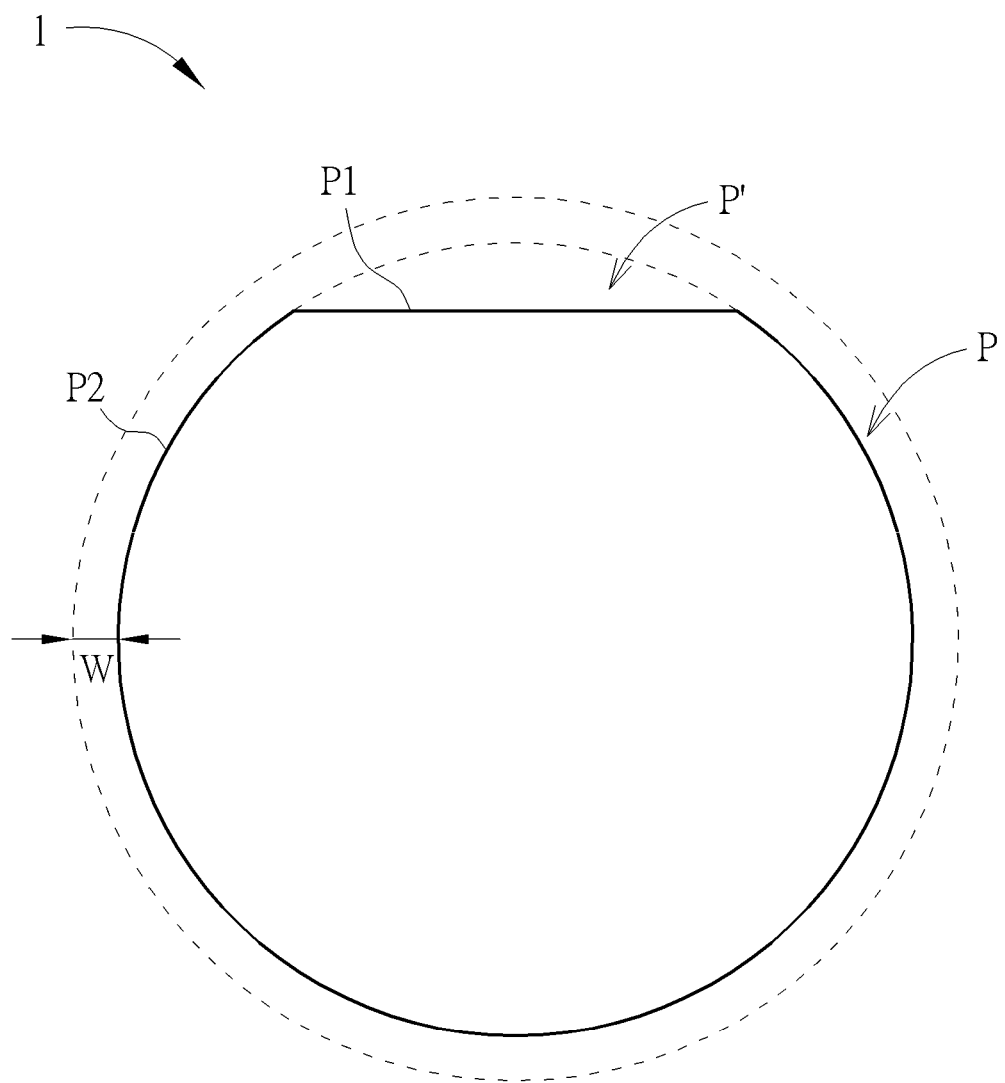
FIG. 3 is an illustration showing a top view of the semiconductor wafer 1 before and after edge trimming.

Please refer to FIG. 2 and FIG. 3. FIG. 3 is an illustration showing a top view of the semiconductor wafer 1 before and after edge trimming. In step 140, a full edge trimming is implemented on the periphery of the semiconductor wafer 1 to remove a portion P of thickness T, i.e., the total thickness of the semiconductor wafer 1. The cutting tool 5 cuts from the back side 12 all the way through the thickness T of the semiconductor wafer 1 to the front side 11 to remove the portion P. A straight side 13 is therefore formed at the periphery of the semiconductor wafer 1 connecting the front side 11 and the back side 12 and in one embodiment, perpendicular to both the front side 11 and the back side 12. In Step 150, a flat portion P1 is further formed at the periphery of the semiconductor wafer 1 by trimming an additional portion P' out of the semiconductor wafer 1 at the periphery. The flat portion P1 is a flat edge connected to an arc portion P2 at the periphery of the semiconductor wafer 1 after the semiconductor wafer 1 is processed in Step 140 and Step 150, which in one embodiment, trimming the periphery of the semiconductor wafer 1 to form the flat portion P1 as in Step 150 is implemented right in the stage of the edge trimming process as in Step 140.

Figure 4:
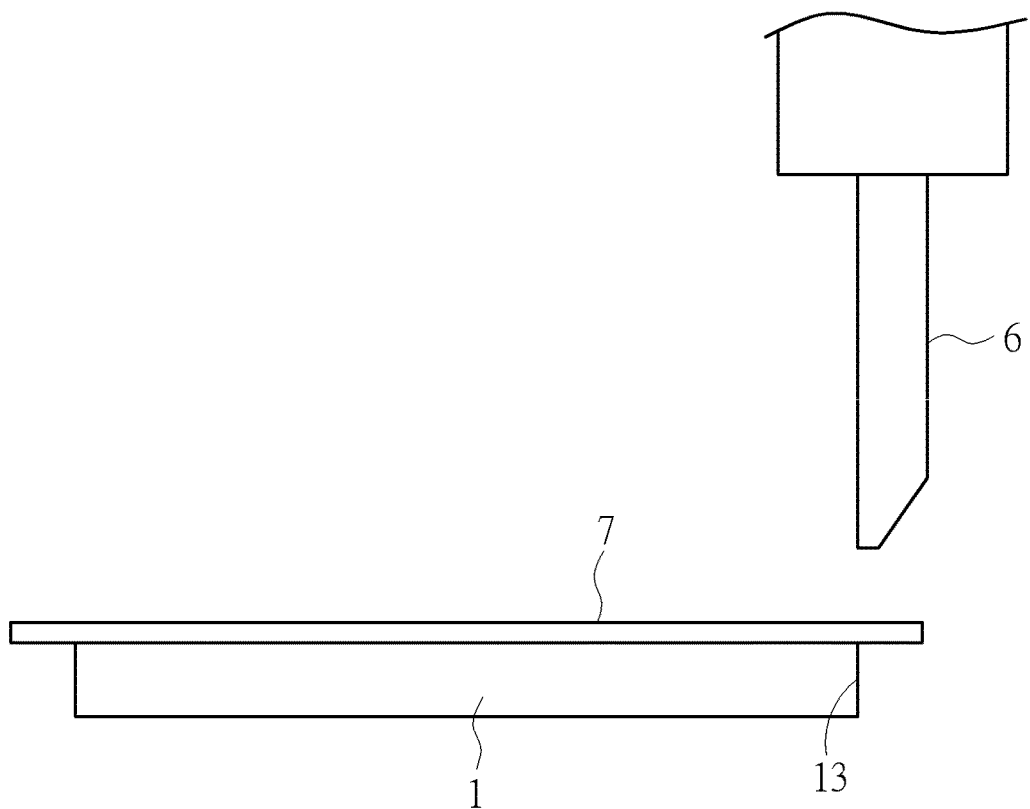
FIG. 4 is an illustration of taping process on the semiconductor wafer.

The embodiment of the invention shows a cut through edge trimming process to the semiconductor wafer 1 after the semiconductor wafer 1 is ground for profiling and before the semiconductor wafer 1 goes to the taping process and later. Please refer to FIG. 4, which is an illustration of taping process on the semiconductor wafer. After edge trimming the semiconductor wafer 1, a tape 7 is mounted to the front side 11 of the semiconductor wafer 1 in the taping process as Step 160. Given the straight side 13 formed in the previous process, a cutting tool 6 for the taping process may remove the excess tape 7 by cutting along the straight side 13 at the periphery of the semiconductor wafer 1. It should be noted that using the cut through edge trimming on the periphery of the semiconductor wafer 1 effectively prevents chipping at the periphery of the semiconductor wafer 1 during the later processes and improves product yield and ultimately profitability. Following the taping process, Step 170 implements backside grind on the back side 12 of the semiconductor wafer 1 as any person skilled in the art has knowledge of.

Positioning of the semiconductor wafer 1 is also crucial to the processes. Taping and backside grind in Steps 160, 170 require mark on the semiconductor wafer 1 for accurate positioning before carrying out the processes. Unlike the conventional V-notch that is highly likely to reduce or vanish in the edge trimming process, the taping and backside grind processes may well facilitate the flat portion P1 formed in the edge trimming process as a positioning means.

The wafer processing method provided by the embodiment of the invention uses the chuck table with smaller diameter than the semiconductor wafer to be processed. A cut through edge trimming is therefore implemented on the periphery of the semiconductor wafer to form a cut through straight side at the periphery and also form a flat portion at the periphery as a positioning means for taping and backside grind processes.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A wafer processing method with full edge trimming, the method comprising steps:

providing a semiconductor wafer having a front side and a back side opposite to the front side, the semiconductor wafer further having a thickness and a first diameter;

providing a chuck table with a second diameter for holding the semiconductor wafer wherein the second diameter is smaller than the first diameter;

implementing edge trimming on a periphery of the semiconductor wafer to remove a portion of the semiconductor wafer of the thickness;

implementing taping on the front side of the semiconductor wafer; and implementing backside grind on the back side of the semiconductor wafer.

2. The wafer processing method of claim 1, further comprising step:

trimming the periphery of the semiconductor wafer to form a flat portion of the periphery of the semiconductor wafer, the flat portion connecting to an arc portion of the periphery to form the periphery of the semiconductor wafer.

3. The wafer processing method of claim 2, wherein trimming the periphery of the semiconductor wafer to form the flat portion of the periphery is implemented in the edge trimming process.

4. The wafer processing method of claim 2, wherein implementing taping on the front side of the semiconductor wafer uses the flat portion of the periphery as a positioning means.

5. The wafer processing method of claim 2, wherein implementing backside grind on the back side of the semiconductor wafer uses the flat portion of the periphery as a positioning means.

6. The wafer processing method of claim 1, wherein implementing edge trimming on the periphery forms a straight side at the periphery of the semiconductor wafer connecting the front side and the back side.

7. The wafer processing method of claim 6, wherein implementing taping on the front side of the semiconductor wafer comprises cutting tape along the straight side at the periphery of the semiconductor wafer.

8. The wafer processing method of claim 6, wherein the straight side is perpendicular to both the front side and the back side.

9. The wafer processing method of claim 1, further comprising performing a half cut process to the front side or the back side of the semiconductor wafer before the semiconductor wafer is provided to the chuck table.

10. The wafer processing method of claim 9, wherein the half cut process comprises blade cut, laser grooving, and stealth dicing.

* * * * *